(12) United States Patent
Hayashi

(10) Patent No.: US 7,782,916 B2
(45) Date of Patent: Aug. 24, 2010

(54) LASER DIODE DRIVER ABLE TO PRECISELY CONTROL THE DRIVING CURRENT

(75) Inventor: Shigeo Hayashi, Yokohama (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 53 days.

(21) Appl. No.: 11/896,597

(22) Filed: Sep. 4, 2007

(65) Prior Publication Data

US 2008/0063018 A1 Mar. 13, 2008

(30) Foreign Application Priority Data

Sep. 4, 2006 (JP) .............................. 2006-239163

(51) Int. Cl.
*H01S 3/00* (2006.01)

(52) U.S. Cl. ............... 372/38.02; 372/38.01; 372/38.07

(58) Field of Classification Search .............. 372/38.01, 372/38.02, 38.07

See application file for complete search history.

(56) References Cited

U.S. PATENT DOCUMENTS 5,502,298 A * 3/1996 Geller ........................ 250/205

6,088,506 A 7/2000 Yoshio et al.
2004/0120369 A1* 6/2004 Fairgrieve et al. ...... 372/29.021

FOREIGN PATENT DOCUMENTS

| JP | 06-164049 | 6/1994 |
|---|---|---|
| JP | 09-282848 | 10/1997 |
| JP | 2000-269897 | 9/2000 |
| JP | 2000-332344 | 11/2000 |

* cited by examiner

*Primary Examiner*—Minsun Harvey
*Assistant Examiner*—Joshua King
(74) *Attorney, Agent, or Firm*—Venable LLP; Michael A. Sartori; Steven J. Schwarz

(57) ABSTRACT

The present invention provides a laser diode driver (LD-driver) able to precisely control the driving current reducing the influence of the overshoot and undershoot of the monitored signal. The LD-driver includes a photodiode (PD), an I/V-converter (I/V-C), a comparator, an integrator, a processing unit, and a current source. The PD generates the photocurrent, the I/V-C converts the photocurrent to a voltage signal, the comparator compares the voltage signal coupled by the AC-mode with a threshold, and the integrator integrates the output of the comparator. The processing unit, based on the output of the integrator, controls the driving current. In the LD-driver, the output of the integrator only determines the control mode, namely, the increment or the decrement of the current, the magnitude of the change in the driving current and its speed are given by the present conditions.

5 Claims, 6 Drawing Sheets

LASER DIODE DRIVER ABLE TO PRECISELY CONTROL THE DRIVING CURRENT

BACKGROUND OF THE INVENTION

1. Field of the Invention

The present invention relates to a driver for a semiconductor laser diode.

2. Related Prior Art

It is well known to control the driving current of the semiconductor laser diode (hereafter denoted as LD) to have the optical output power and the extinction ratio thereof stable by monitoring the optical output thereof with a photodiode (hereafter denoted as PD) and comparing the output from the PD with a reference. Various prior applications have disclosed such driving circuit, some of which have used a peak hold circuit to detect the peak level of the optical output from the LD and the driving current being adjusted so as to keep the peek level constant.

When the noise is superposed on the photocurrent detected by the PD and accordingly on the monitored voltage signal derived from the photocurrent, the peak hold circuit holds the peak level with the noise, which is different from the true monitored signal. Moreover, when the transmitting data continues the same level, an overshoot or undershoot may occur at the leading or falling edge of the data at the first transition after the continued level. These overshoot and undershoot may cause the error in the peak hold circuit because the peak hold circuit holds the peak level of these overshoot and undershoot. Thus, it is hard to precisely control the driving current based on the signal generated by the conventional peak hold circuit.

The present invention is to provide a LD-driver able to control the driving current of the LD with reducing the effect of the noise and the over- and under-shoots appeared in the monitored signal.

SUMMARY OF THE INVENTION

According to a feature of the present invention, a laser diode driver (LD-driver) comprises a first comparator, an integrator, a processing unit and a current source. The LD-driver controls, in accordance with a transmitting signal, a driving circuit that is supplied to the LD based on a monitored signal derived from a PD that monitors optical output power of the LD. The first comparator compares the monitored signal with a first threshold. The integrator integrates an output of the first comparator. The processing unit, by receiving an output of the integrator, generates a control signal. The current source generates the driving current in accordance with the control signal from the processing unit. In the present invention, the output of the integrator determines only the change mode of the control signal, namely, whether the control signal is to be increased or to be decreased. The change rate of the control signal is kept constant. The processing unit may include a second comparator that compares the output of the integrator with a second threshold. The change mode of the control signal may be determined only by the output of the second comparator.

When the monitored signal is greater than the first threshold, the first comparator outputs a high level, for instance 1 V, while, the former is smaller than the latter, the comparator outputs a low level, for instance 0 V. When the mark density rate of the transmitting signal is ½, the integrated output of the comparator becomes 0.5 V when a state the monitored signal exceeds the first threshold continues, and the integrated result becomes 0 V when a state the monitored signal is less than the first threshold continues. Taking the noise in the optical signal and overshoots or undershoots appeared in the monitored signal into consideration, the integrated output of the integrator falls in a range 0 ~0.5 V.

Comparing this integrated result with the second threshold, the processing unit determines the change mode of the control signal, that is, whether the control signal is to be increased or to be decreased. Assuming the second threshold is 0.25 V, when the integrated result exceeds 0.25 V, then the control signal is to be decreased, while, the result is less than 0.25 V, then the control signal is to be increased. The processing unit generates the control signal, a sign of which is thus determined by the integrated result and a change rate of which depends on the preset values.

The LD-driver of the present invention may reduce the noise effect and, even the monitored signal includes the overshoot and the undershoot in the signal shape thereof; these factors to cause the control of the driving current to degrade may be effectively suppressed.

DESCRIPTION OF PREFERRED EMBODIMENTS

Next, preferred embodiments of a laser diode driver according to the present invention will be described as referring to accompanying drawings. In the description of drawings, the same symbols or numerals will refer to the same elements without overlapping explanations.

First Embodiment

Figure 1:
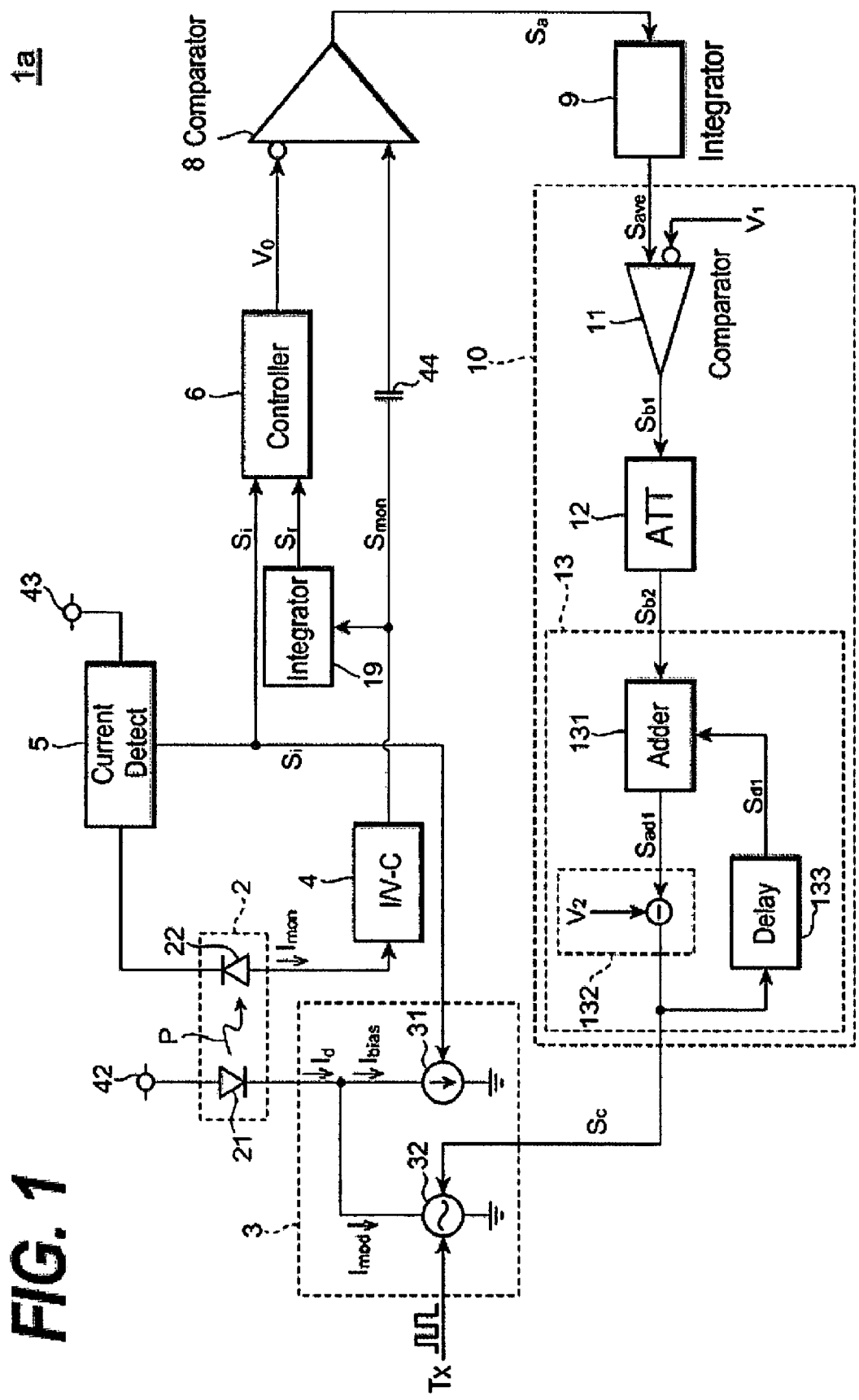
FIG. 1 is a block diagram of the LD-driver according to the first embodiment of the invention.

FIG. 1 is a block diagram of a laser diode driver (hereafter denoted as LD-driver) $1a$ as the first embodiment of the present invention. The LD-driver $1a$ drivers the optical device 2 that includes a laser diode (hereafter denoted as LD) 21 to emit signal light p and a photodiode (hereafter denoted as PD) 22 to monitor the signal light P. The LD 21 generates the signal light p by receiving a driving current Id including a modulation current Imod, which follows the transmission signal Tx input from the outside, and a bias current Id, which is stationary, from the LD-driver $1a$.

Generally, the laser diode 21 has large temperature dependence in its characteristics. That is, raising the temperature of the LD 21, the threshold current for the laser oscillation becomes large and the slope efficiency thereof becomes small, accordingly, the larger driving current becomes necessary to obtain a preset optical output power. To maintain the optical output power and the extinction ratio independent of the temperature, it is necessary to adjust the bias and modulation currents, Ibias and Imod, depending on the temperature. Hence, the driver 1a is necessary to compensate the temperature dependence of the LD 21 by; (1) providing the driving current Id that follows the transmitting signal Tx to the LD 22, (2) monitoring the optical output from the LD by the PD 21, and (3) adjusting the driving current Id, which is a sum of the bias current Ibias and the modulation current Imod, based on the current output Imon from the PD 22.

The LD-driver of the present embodiment provides the current generator 3, the current-to-voltage converter 4, the current detector 5, the control unit 6, the comparator 8, the integrators, 9 and 19, the processing unit 10, and the capacitor 44.

The current generator 3 supplies the driving current Id, a portion of which is modulated so as to follow the transmitting signal Tx, to the LD 21. The current generator 3 includes two current sources, one of which is the bias current source 31 and the other of which is the modulation current source 32. The former source 31 generates the bias current Ibias, that is, the bias current source 31 adjusts the bias current Ibias such that the signal Si output from the current detector 5 becomes substantially equal to a preset value.

The latter source 32 generates the modulation current Imod that follows the transmitting signal Tx, that is, the modulation current source 32 adjusts and provides the modulation current Imod such that the magnitude of the modulation current Imod, which is modulated so as to follow the external transmitting signal Tx, becomes substantially equal to the signal Sc output from the processing unit 10.

The current-to-voltage converter (hereafter denoted as I/V-C) 4 converts the photocurrent Imon output from the PD 22 to a corresponding voltage signal Smon. This converted signal Smon is output to the comparator 8 through the capacitor 44 and to the integrator 19 without through the capacitor 44. The coupling capacitor 44 interposed between the I/V-C 4 and the comparator 8 cuts the bias component included in the signal Smon and passes only the modulation component in the signal Smon to the comparator 8.

The current detector 5 generates a signal Si that reflects an average of the photocurrent Imon. The current detector 5 may be, for example, a resistor interposed between the PD 22 and the power supply 43 and a capacitor connected between the cathode of the PD 22 and the ground. Thus, the current detector 5 may output the signal Si by detecting a voltage between two terminals of the resistor. This signal Si is output to the control unit 6 and the bias current source 31.

The first integrator 19 generates an average Sr of the signal Smon output from the I/V-C 4 by integrating it. The integrator 19 may be a low-pass filter constituted of a resistor and a capacitor. The integrator 19 outputs thus filtered signal Sr to the control unit 6.

The control unit 6 adjusts the reference $V_0$ given to the comparator based on the conversion ratio of the I/V-C 4, where the reference $V_0$ becomes a threshold in the comparator 8. The control unit 6 estimates the conversion ratio of the I/V-C 4 based on the average Si of the photocurrent Imon and the signal Smon that reflects the raw photocurrent Imon. The control unit 6 outputs thus evaluated threshold $V_0$ to the comparator 8.

The comparator 8, which is the first comparator of the present embodiment, generates a difference Sa between the signal Smon, which is the AC component of the photocurrent Imon and the threshold $V_0$. Specifically, the inverting input of the comparator 8 receives the threshold $V_0$ from the control unit 6, while, the non-inverting input thereof receives the converted data Smon but filtered by the capacitor 44 from the I/V-C 4. When the signal Smon exceeds the threshold $V_0$, the comparator 8 outputs a high level, for instance, 1 V, on the other hand, when the signal Smon is smaller than the threshold $V_0$, the comparator 8 outputs a low level, for instance, 0 V. The integrator 9 integrates the output of the comparator 8 to generate the signal Save. The integrator may be a low pass filter constituted by a resistor and a capacitor.

The processing unit 10 generates the control signal Sc based on the averaged signal Save. That is, the processing unit 10 compares the averaged signal Save with a second threshold V1 to determine the control mode, that is, whether the driving current should be increased or decreased. The processing unit 10, based on the control mode above, increases or decreases the signal Sc in accordance with a predetermined time function. Next, a detail of the processing unit will be described.

The processing unit 10 includes a second comparator 11, an attenuator 12, and a correlation unit 13. The comparator 11 receives the averaged signal Save in the non-inverting input thereof, while, receives the second threshold V1 in the inverting input thereof. The comparator 11 compares the averaged signal Save with the second threshold V1 and outputs the comparison result Sb1 to the attenuator 12. The second threshold V1 may be externally provided or generated by the constant voltage source within the LD-driver 1a.

The comparator 11 outputs the high level, for instance 1 V, when the averaged signal Save exceeds the second threshold $V_1$, while outputs the low level, 0 V, when the averaged signal Save is smaller than the second threshold $V_1$.

The attenuator 12 attenuates the output Sb1 of the second comparator 11, and may be constituted of resistors. The attenuator 12 attenuates the signal Sb1 by, for instance 1/500, namely 0.002 V for 1 V input. In a modification, the attenuator 12 may be an amplifier with a gain thereof smaller than 1.

The correlation unit 13, by receiving the attenuated signal Sb2 from the attenuator 11, and increases or decreases the control signal Sc depending on the attenuated signal Sb2 in accordance with the preset time function. The time function may include a function with an output thereof increasing or decreasing with time going, or a function with an output thereof logarithmically increasing or decreasing with time going. That is, the correlation unit 13 processes the signal Sb2 only for determining the mode, namely the increase or decrease the control signal Sc, and the rate of the change in the control signal Sc is kept constant independent of the difference of the current magnitude of the optical output denoted by the signal Smon from the target value.

The correlation unit 13 includes an adder 131, a subtracter 132 and a delay unit 133. The adder 131 receives the signal Sb2 from the attenuator 12 in one input thereof, while it receives the output Sd1 of the delay unit 133 in the other input thereof. The adder 131 outputs the added signal Sad1, which is a sum of the signal Sb2 and the output Sd1, to the subtracter 132.

The subtracter 132 decreases the added signal Sad1 by a constant value $V_2$. The subtracter 132 sends the output thereof to the modulation current source 32 and the delay unit 133. The constant value $V_2$ is determined between values the signal Sb2 may be set. For instance, when the signal Sb2 changes between two levels, 2 mV and 0 mV, the constant value may be 1 mV between these levels.

As a modification of the subtracter 132 except for the protocol to decrease the added signal Sad1 by the constant value V2, the added signal Sad1 may be decreased by a constant rate. The output from the subtracter 132 is sent to the modulation current source 132 as the control signal Sc to control the modulation current Imod.

The delay unit 133, by receiving the output Sc from the subtracter 132, delays this signal to output the delayed signal Sd1 to the adder 131. Specifically, the delay may be a low pass filter with a time constant, which is preferable to be greater than a time summing the time constants of the other unit including the integrator 9 the except for the delay unit 133.

The function appeared in the attenuator 12 and the correlation unit 13 may be performed by a digital processor with a digital-to-analog converter. In this case, the processor receivers the output Sb1 of the comparator 11, and provides the output Sc thereof to the modulation current source through the digital-to-analog converter. The processor increase or decreases the control signal Sc based on output from the comparator 11 in accordance with the preset time function.

An algorithm to adjust the driving current by the LD driver 1a will be described. In the explanation below, a symbol VH corresponds to the high level of the signal Smon, which reflects the high state in the transmitting signal Tx, that is, the optical output from the LD becomes pH, while, a symbol VL denotes the low level of the signal Smon, which corresponds to the low statue in the transmitting signal Tx when the optical output from the LD becomes pL.

The LD-driver 1a controls the bias current Ibias only by the output Si from the current detector 5. Because the signal Si denotes the average of the photocurrent Imon, the bias current Ibias may be so adjusted that the average of the signal Smon, which is denoted by (VH+VL)/2, becomes constant, when the mark density ratio assumes to be 1/2. That is, whatever the correlation unit 10 adjusts the modulation current, in other words, whatever the amplitude of the optical signal changes, the average of the signal Smon, which is equal to (VH+VL)/2, may be kept in the preset target value.

Figure 2:
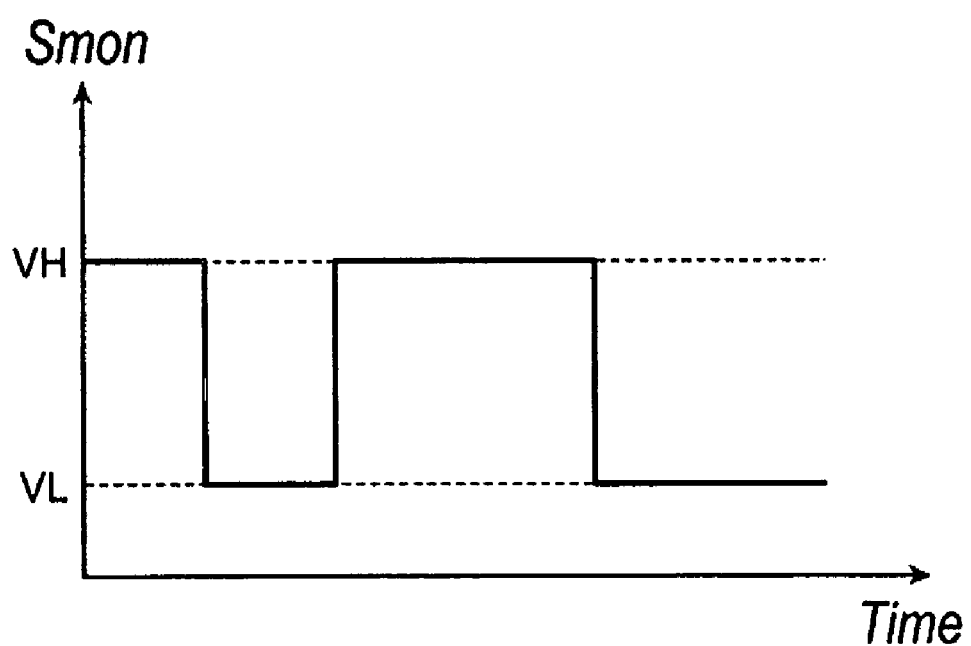
FIG. 2 is an example of the monitored signal output from the current-to-voltage converter.

For the explanation sake, it is assumed that the first threshold $V_0$ input in the first comparator 8 is equal to the target value $S_0$ for the signal Smon and the high level output of the comparator 8 is 1 V, which corresponds a case that the signal Smon exceeds the threshold $V_0$ (=$S_0$), while, the low level thereof is 0 V, which corresponds to a case the signal Smon is smaller than the threshold $V_0$. Similarly, it is assumed that the high level output Sb1 of the second comparator 11 is 1 V, which corresponds to a case the averaged signal Save exceeds the second threshold $V_1$, while, the low level thereof is 0 V. Moreover, as shown in FIG. 2, it is further assumed that the mark density ratio of the signal Smon, which directly reflects the mark density ratio of the transmitting signal Tx, is 1/2 with no overshoots or undershoots, the range of the output from the correlation unit 10 is from 0 to 1 V, and the modulation current Imod is reversely proportional to the control signal Sc.

Further Assuming the follows: the optical output p from the LD 21 becomes the target value when the control signal Sc is 700 mV; the first threshold $V_1$ is 0.25 V; the constant value $V_2$ is 1 mV; the initial condition of the signal Sc is 100 mV; the delay time of the delay 13 is td; the dividing ratio of the attenuator 12 is 1/500. Based on the condition above, the attenuator 12 generates the signal Sb2 whose levels are only 0 mV or 2 mV.

A symbol $VH_0$ corresponds to the high level of the signal Smon when the LD 21 outputs the optical signal with the high and low levels each satisfying the target values. When the high level VH of the signal Smon becomes greater than the first threshold $V_0$, the output Sa of the comparator 8 becomes 1 V when the transmitting signal Tx is in its high level. Because the mark density ratio of the transmitting signal Tx is 1/2, the output Save of the integrator 9 becomes 0.5 V. In this case, because the second threshold V1 for the second comparator 11 is 0.25 V, the output Sb1 of the comparator 11 becomes 1 V and that Sb2 of the attenuator 12 is 2 mV.

Because the initial condition of the control signal Sc is 100 mV, the output Sad1 from the adder 131 becomes 102 mV, and the control signal Sc becomes 101 mV by the subtraction by 1 mV at the subtracter 132. This processed control signal Sc is feed-backed with a lag td by the delay unit 133 to the adder 131, the adder 131 adds this feed-backed signal with the output Sd2 from the attenuator 12 to generate the new value 101+2=103 mV, and the subtracter 132 decreases this value by 1 mV to generate a new control signal of 1032 mV.

In the condition above, the control signal Sc of 700 mV in the level thereof corresponds to the target magnitude in the optical signal, accordingly, a condition when the control signal is 101 mV still maintains a state the signal Smon greater than the first threshold $V_0$. Accordingly, the correlation unit continues to increase its output Sc by the step of 1 mV with a time interval of td, and the modulation current continues to decrease.

When the signal Sc exceeds 700 mV, which is the target value, and becomes 701 mV, the output Sa of the comparator 8 is 0 V because the monitored signal Smon becomes smaller than the first threshold $V_0$. Accordingly, the output Save from the integrator 9 also becomes 0 V and the output Sb1 from the second comparator 11 becomes 0. In this case, the adder 131 performs no increment, that is, the output Sad1 thereof is maintained even after the lag td. Thus, the control signal Sc becomes 699 mV, decreased by 1 mV at the subtracter 132 and the modulation current increases.

Thus, the correlation unit 13 increases or decreases the control signal Sc depending on the output Sb1 from the comparator 11. In other words, after the target condition is achieved, which is 700 mV in the above example, the control signal Sc may increase or decrease by one unit around the target condition. Even the initial condition of the control signal is greater than the target condition, for example, in the case that the initial control signal Sc is 900 mV, the control signal continues to decrease its value until the target value 700 mV and after the target condition is achieved, the signal Sc varies by one unit around the target condition.

Figure 3A:
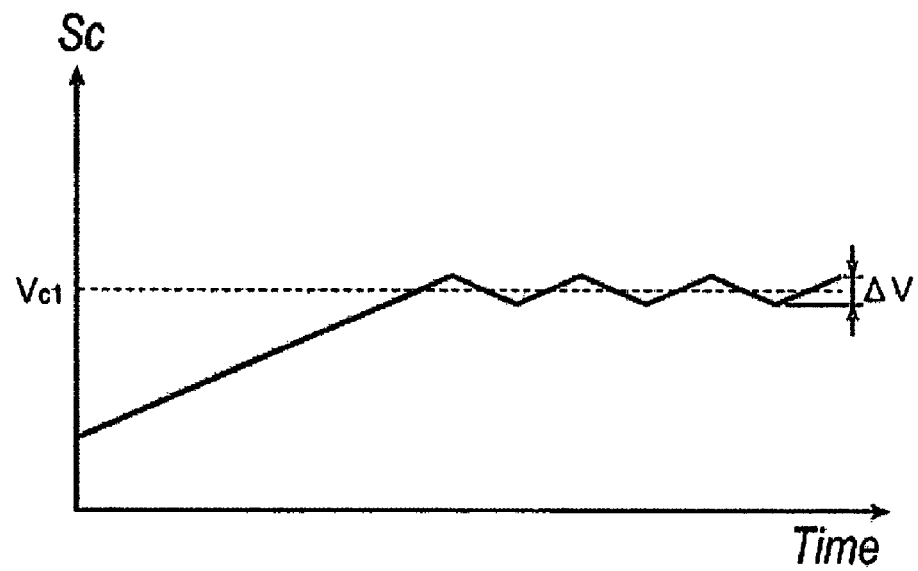
FIG. 3A schematically illustrates a behavior of the control signal that converges on the target value when the initial condition of the signal is less than the target value, and FIG. 3B schematically illustrates a behavior thereof when the initial condition exceeds the target value.
Figure 3B:
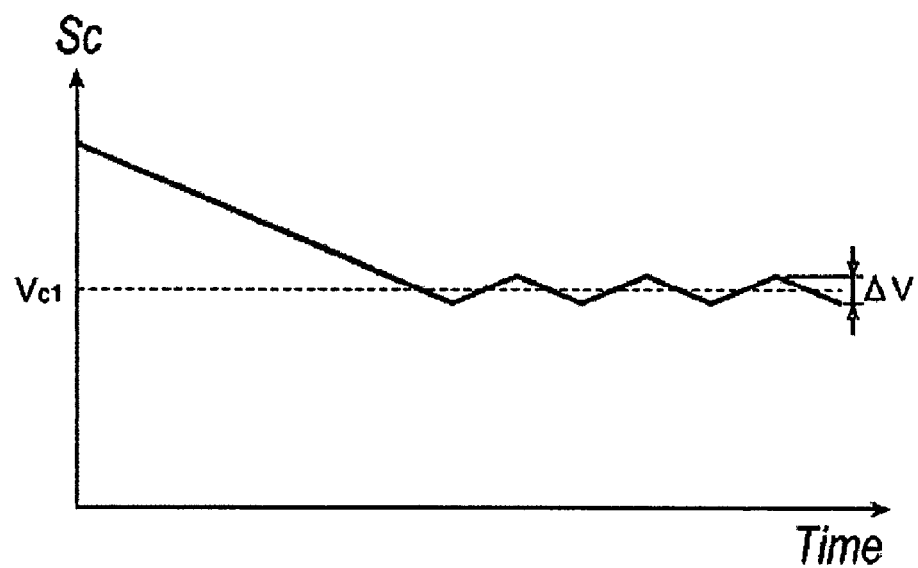

FIGS. 3A and 3B schematically show the convergence of the control signal Sc in the target value Vc1. FIG. 3A corresponds to a case where the initial condition of the signal Sc is smaller than the target value, while FIG. 3B corresponds to a case where the initial condition is greater than the target value. As FIGS. 3A and 3B illustrate, the control signal Sc changes in accordance with the time dependent function. Moreover, it is well understood that the control signal may converge in a quite narrow range $\Delta V$, ±1 mV in the above example. The slope of the time dependent function may be determined by the output Sb2 of the attenuator 12, the constant V2 of the subtracter 132 and the delay time td of the delay unit 133.

Practically, the behavior of the control signal Sc around the target value Vc1 reflects further complex factors, such as the high level of the optical signal fluctuates, the signal Smon shows a substantial time at the rising and falling edges, occasionally accompanied with steep overshoots and undershoots. However, the control signal Sc ultimately converges in the target value. To escape from those complex phenomena, it may be preferable to set a difference between the first threshold $V_0$ and the target amplitude $S_0$ of the monitored signal Smon.

Next, the present embodiment will be compared to an arrangement without the processing unit 10, that is, the output Save of the integrator directly controls the modulation current source. According to this arrangement, the driving current occasionally becomes unstable, that is, the current becomes nearly zero at an instant, becomes the maximum at a next instant and iterates the zero and the maximum, which is peculiar behavior of the feedback loop. The present LD-driver 1a in the control signal Sc thereof, because of the processing unit 10, may converge on the target value. Moreover, the present LD-driver may escape from the noise compared to the conventional arrangement, and even may count the noise effect by adjusting the thresholds, $V_0$ and $V_1$.

The conventional peak-detection method in the LD-driver holds the maximum of the monitored signal Smon within a preset period. Accordingly, superposing the noise on the monitored signal Smon, the peak detector holds the peak level with the noise, which causes the great difference from the true peak level of the monitored signal Smon.

The present LD-driver 1a averages the difference of the monitored signal Smon from the first threshold $V_0$ at the integrator 9, which is equivalent to a case where the LD-driver 1a detects the period when the monitored signal Smon exceeds the threshold $V_0$. Moreover, the LD-driver 1a generates the driving current Id based on such averaged signal Save, accordingly, the influence of the noise may be quite suppressed by integrating the output Sa of the comparator 8 even the monitored signal Smon instantaneously increases due to the noise.

Figure 4:
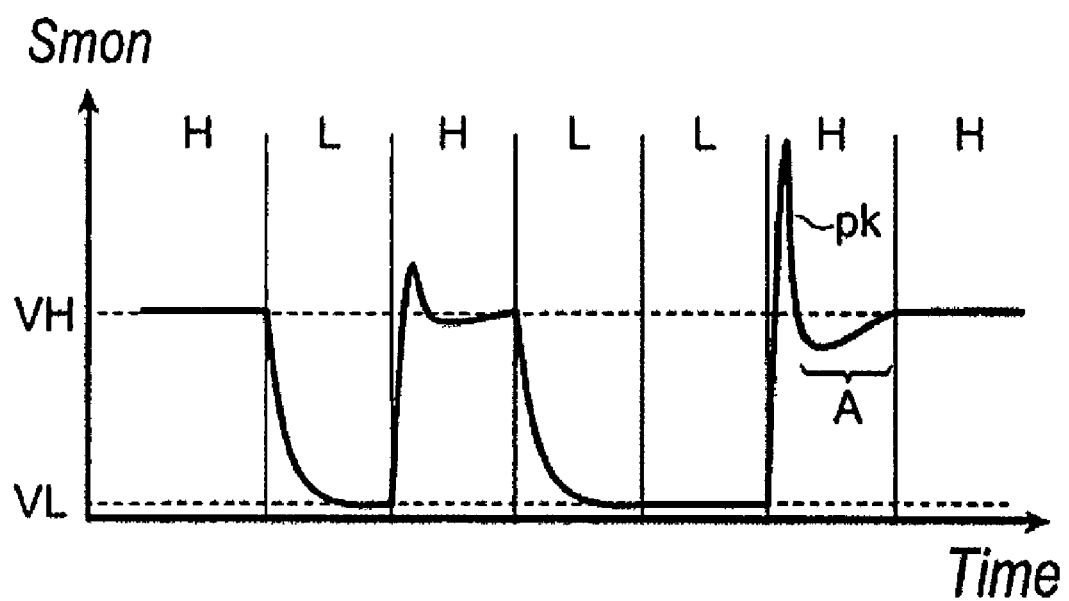
FIG. 4 shows a typical waveform of the monitored signal that includes an overshoot at the leading edge thereof and an undershoot subsequently appeared to the peaked overshoot.

FIG. 4 shows a typical noise shape appeared in the monitored signal Smon. As FIG. 4 illustrates, an overshoot appears at the leading edge of the monitored signal after the continued low level and a relatively long under shoot continues in a period A after the peaked over shoot. However, these overshoot and undershoot may be escaped by averaging the high level of the monitored signal Smon. Therefore, the LD-driver according to the present embodiment, even the monitored signal contains a large quantity of noise, may escape from the noise effect and precisely control the driving current Id.

Thus, the present LD-driver 1a has different features from the conventional driver, in which the magnitude of the optical output is detected in a preset timing and the driving current is adjusted based on the detected information, (1) the control signal Sc to set the optical output continues to oscillate with a period determined by the delay unit 133; and (2) the monitored signal Sc is used only for deciding the mode, the increment or the decrement, of the current and the practical width of the change in the current is based on the preset time function.

The control unit 6 of the present LD-driver 1a varies the first threshold V0 depending on the conversion gain of the I/V-C 4. The control unit 6 may change the threshold V0 based on the average of the photocurrent Imon, or both of the conversion gain of the I/V-C 4 and the average of the photocurrent Imon.

Moreover, the LD-driver is preferable to set the capacitor 44 between the I/V-C and the first comparator 8. This capacitor 44 cut the DC-component contained in the monitored signal Smon, which eliminates the DC-offset generated in the I/V-C 4.

Figure 5:
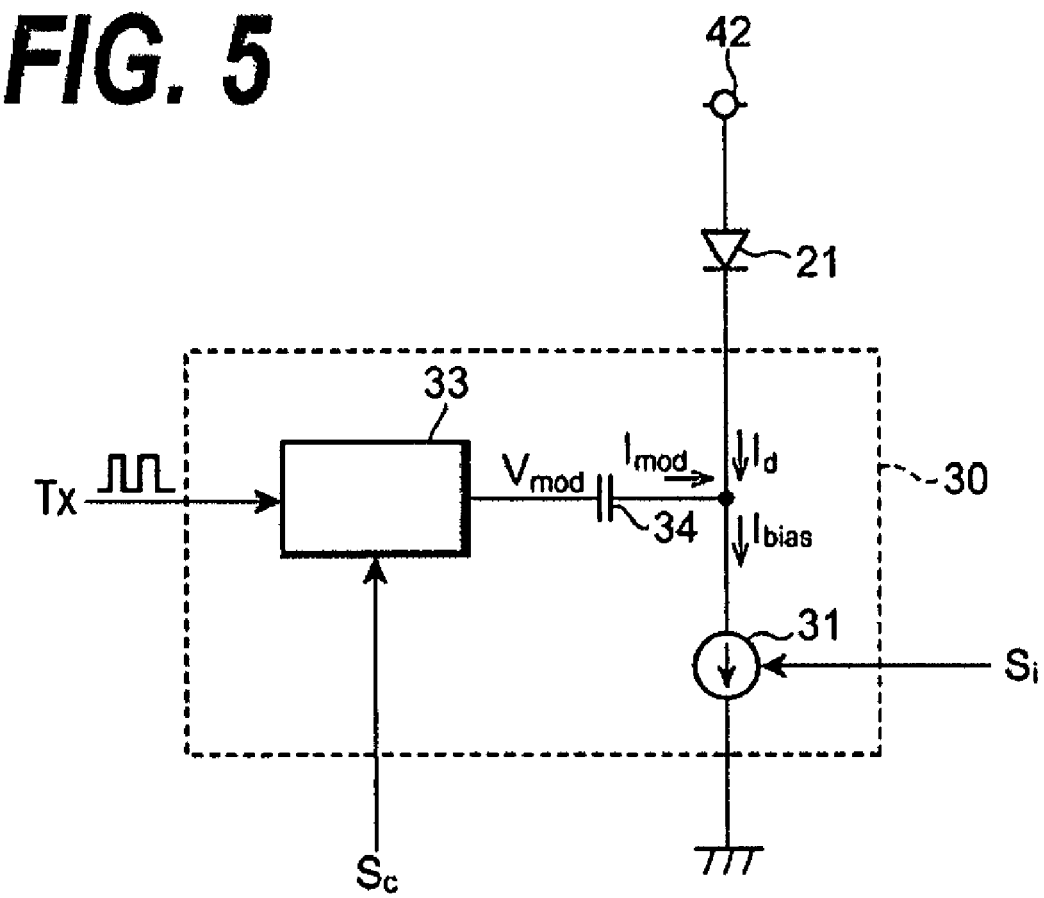
FIG. 5 shows a modification of the current source with an AC-coupled type.

FIG. 5 is a modification of the current generator 3 shown in FIG. 1. This current modulator 30 has an AC-coupled feature between the modulation current source and the LD 21. The LD-driver 1a may install this type of the current generator 30.

The current generator 30 also provides the driving current Id, which is partly modified in accordance with the transmitting signal Tx, to the LD 21. The generator 30 includes two current sources, one of which is the bias current source 31 and the other is the modulation current source 33. The bias current source 31 is the same as that shown in FIG. 1.

The modulation current source 33 generates a modulation signal Vmod in accordance with the transmitting signal Tx. Specifically, the modulation current source 33 receives the external transmitting signal Tx and the control signal Sc from the processing unit 10 to provide the modulation signal Vmod to the LD 21 through the capacitor 34. Thus, the modulation current Imod may be generated in accordance with the transmitting signal Tx. The modulation current source 33 may adjust the magnitude of the modulation signal Vmod corresponding to the control signal Sc.

Second Embodiment

Figure 6:
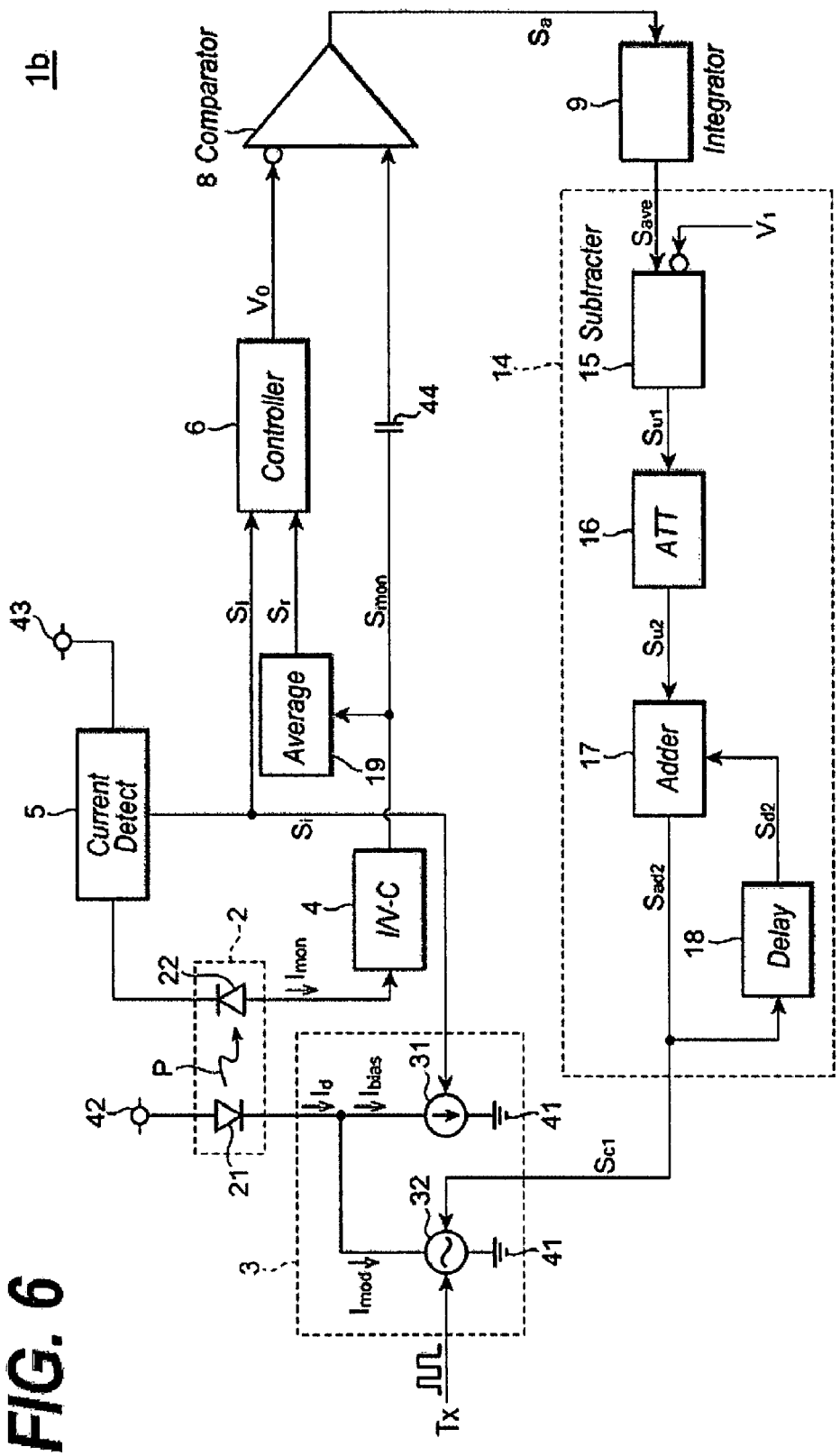
FIG. 6 is a block diagram of the LD-driver according to the second embodiment of the invention.

FIG. 6 shows a block diagram of the LD-driver according to the second embodiment of the invention. The LD-driver 1b includes the current generator 3, the I/V-C 4, the current detector 5, the control unit 6, the comparator 8, the integrators, 9 and 19, the processing unit 14, and the capacitor 44. Block above except for the processing unit 14 are same as those described in the first embodiment.

The processing unit 14 of the present embodiment includes the comparator 15, the attenuator 16, the adder 17 and the delay unit 18. The subtracter 15 subtracts the second threshold $V_1$ from the output Save of the integrator to generate a subtracted signal Su1. The attenuator 16 attenuates the output Su1 of the subtracter 15 by, for example, 1/25, to generate the attenuated output Su2. This attenuator 16 may be constituted by a resistor ladder or an amplifier with a gain smaller than unity. One input of the adder 17 receives the attenuated output Su2 from the attenuator 16, while, the other input thereof receives the output Sd2 of the delay unit 18 to generate the added output Sad2 and to provide this output Sad2 to the modulation current source 32 as the control signal Sc1. The modulation current source 32 generates the modulation current Imod, which is reversely proportional to the control signal Sc to the LD 21. On the other hand, the delay unit 18 generates the delayed output Sd2 by delaying the output Sad2 to provide the adder 17. The delay unit 18 may be similar to that explained in the first embodiment.

In the present LD-driver 1b, the subtracter 15 subtracts the threshold $V_1$ from the averaged output Save. When the driving signal Id exceeds the target value and the averaged output Save exceeds the threshold $V_1$, the adder 17 receives a positive output of the subtracted signal Su2. Accordingly, the output Sad2 of the adder 17 increases in accordance with the preset time function determined by the delay unit 18. The output Sad2 of the adder 17, as mentioned above, is led to the modulation current source 32 to decrease the driving current Id.

Oppositely, when the driving current Id is smaller than the target value, the averaged output Save becomes less than the threshold $V_1$, and the adder 17 receives a negative value of the subtracted output Su2. Accordingly, the output Sad2 of the adder 2 decreases in accordance with the time function and the driving current Id increases.

Thus, the LD-driver 1b of the present embodiment, similar to the first embodiment, the mode of the control signal Sc, namely, the increment or the decrement of the driving current, is determined by the averaged output Save of the difference between the monitored signal Smon and the first threshold $V_0$, and the control signal Sc1 increases or decreases in accordance with the time function whose behavior may be determined by the delay unit 18, in particular, a delay time thereof. In the present embodiment, the subtracted output Su1 of the subtracter 15 depends on a difference between the monitored signal Smon and the threshold $V_0$, accordingly, the behavior of the control signal Sc1 becomes a non-linear function against the time, not shows a linear dependence as those illustrated in FIGS. 3A and 3B.

The explanation above is based on a condition where the mark density ratio is 1/2. The present LD-driver 1b is applicable for cases where the mark density ratio of the transmitting signal Tx is apart from 1/2. However, it is necessary to adjust the second threshold $V_1$ in accordance with the mark density ratio. For instance, when the mark density ratio is 1/5, the ratio of the high level (1 V) to the low level (0 V) becomes 1/4 at the output Sa of the comparator 8, the averaged output Save of the integrator 9 becomes 0.2 V. In this case, the second threshold $V_1$ is preferable to be a half of it, namely, about 0.1 V. Thus, the present LD-driver 1b is applicable for the transmitting signal Tx with different mark density ratio by adjusting the threshold $V_1$. Moreover, for the transmitting signal with dynamically varied mark density ratio, the LD-driver 1b is applicable by providing an integrator to integrate the transmitting signal Tx and by adjusting the threshold $V_1$ depending on the output of this integrator.

While the preferred embodiments of the present invention have been described in detail above, many changes to these embodiments may be made without departing from the true scope and teachings of the present invention. The present invention, therefore, is limited only as claimed below and the equivalents thereof. For instance, the embodiments adjust the first threshold $V_0$ depending on the conversion gain of the I/V-C 4. However, the first threshold $V_0$ may be constant. Moreover, although the embodiments provide the attenuator downside of the second comparator 11 or the subtracter 15, the attenuator may be set in another position depending on the output levels of the comparator or the subtracter. The control signal Sc may be provided to the current source with adjusting the phase thereof synchronized with that of the optical signal.

I claim:

1. A laser diode driver that controls a driving current in accordance with a transmitting signal, the driving current being supplied to the laser diode based on a monitored signal derived from a photodiode that monitors optical output power of the laser diode, comprising:
    a first comparator configured to compare the monitored signal with a first threshold;
    an integrator configured to integrate an output of the first comparator;
    a processing unit configured to generate, by receiving an output of the integrator, a control signal that includes information of a change mode and a change rate, wherein the processing unit includes a second comparator and a correlation unit, the second comparator being configured to compare the output of the integrator with a second threshold; the correlation unit having an adder, a subtractor and a delay unit and to generate an output corresponding to the change mode, the adder adding an output of the delay unit with the output of the second comparator, the subtractor subtracting a preset value from an output of the adder, the delay unit delaying an output of the subtractor, wherein the correlation unit changing the control signal by a preset amount within a preset time in accordance with the change mode; wherein the processing unit provides the output of the subtractor as the control signal; and
    a current source configured to generate the driving current in accordance with the control signal output from the processing unit,
    wherein the change mode of the control signal corresponds to a state whether the driving current is to be increased or decreased, and
    wherein the change rate of the control signal is kept constant by the processing unit.

2. The laser diode driver according to claim 1, wherein the second threshold depends on a mark density ratio of the transmitting signal.

3. The laser diode driver according to claim 1,
    further comprising a current-to-voltage converter to convert a photocurrent generated by the photodiode into the monitored signal with a conversion gain,
    wherein the first threshold is based on at least one of the conversion gain of the current-to-voltage converter or an average of the monitored signal.

4. The driver circuit according to claim 1, wherein the second threshold depends on a mark density ratio of a transmitting signal by which the laser diode is modulated.

5. The driver circuit according to claim 1, further comprising a current-to-voltage converter to convert a photocurrent generated by the photodiode into the monitored signal with a conversion gain, wherein the first threshold is based on at least one of the conversion gain of the current-to-voltage converter or an average of the monitored signal.

* * * * *